(12) United States Patent
Petrick

(10) Patent No.: US 9,705,320 B1
(45) Date of Patent: Jul. 11, 2017

(54) APPARATUS FOR CONTROLLING LOW POWER VOLTAGES IN SPACE BASED PROCESSING SYSTEMS

(71) Applicant: The United States of America, as represented by the Administrator of the National Aeronautics and Space Administration, Washington, DC (US)

(72) Inventor: David J. Petrick, Severna Park, MD (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 484 days.

(21) Appl. No.: 14/041,510

(22) Filed: Sep. 30, 2013

Related U.S. Application Data

(60) Provisional application No. 61/790,944, filed on Mar. 15, 2013.

(51) Int. Cl.
  *H02J 3/14* (2006.01)
  *H02J 1/00* (2006.01)
  *H02H 3/087* (2006.01)

(52) U.S. Cl.
  CPC .............. *H02J 1/00* (2013.01); *H02H 3/087* (2013.01)

(58) Field of Classification Search
  CPC .................................. H02J 1/00; H02H 3/087
  USPC .......................................................... 307/39
  See application file for complete search history.

(56) References Cited

U.S. PATENT DOCUMENTS

| 5,539,299 A * | 7/1996 | Fernandez ............ H02J 7/0031 320/134 |
| 6,055,149 A * | 4/2000 | Gillberg .............. H01L 27/0248 361/103 |
| 6,225,797 B1 * | 5/2001 | Willis ..................... G05F 1/573 323/351 |
| 6,388,343 B1 * | 5/2002 | Michigami ............... G06F 1/26 307/112 |
| 2002/0039037 A1 * | 4/2002 | Takada ............... H03K 17/0822 327/108 |
| 2005/0217260 A1 * | 10/2005 | Desjardins .............. F16D 31/02 60/421 |
| 2008/0030077 A1 * | 2/2008 | Tiry ....................... B64G 1/428 307/43 |
| 2010/0327792 A1 * | 12/2010 | Huang ................... G01K 13/00 318/471 |
| 2012/0293017 A1 * | 11/2012 | Lidsky ................... H02H 3/087 307/126 |
| 2014/0139143 A1 * | 5/2014 | Navabi-Shirazi .. H05B 33/0887 315/310 |

(Continued)

*Primary Examiner* — Rexford Barnie
*Assistant Examiner* — Toan Vu

(57) ABSTRACT

A low power voltage control circuit for use in space missions includes a switching device coupled between an input voltage and an output voltage. The switching device includes a control input coupled to an enable signal, wherein the control input is configured to selectively turn the output voltage on or off based at least in part on the enable signal. A current monitoring circuit is coupled to the output voltage and configured to produce a trip signal, wherein the trip signal is active when a load current flowing through the switching device is determined to exceed a predetermined threshold and is inactive otherwise. The power voltage control circuit is constructed of space qualified components.

13 Claims, 5 Drawing Sheets

(56) References Cited

U.S. PATENT DOCUMENTS

2014/0240884 A1* 8/2014 Chang .................... H02H 9/025
361/93.1

* cited by examiner

APPARATUS FOR CONTROLLING LOW POWER VOLTAGES IN SPACE BASED PROCESSING SYSTEMS

This application claims priority to Provisional Application No. 61/790,944, entitled "SPACECUBE 2.0 SYSTEM." filed Mar. 15, 2013. The content of this application is hereby incorporated by reference.

The invention described herein was made by an employee of the United States Government and may be manufactured and used by or for the Government of the United States of America for governmental purposes without the payment of any royalties thereon or therefor.

FIELD

The aspects of the present disclosure relate generally to space-based processing systems, and in particular, to low power voltage control circuits.

BACKGROUND

Many space-based science missions require "next generation" on-board processing capabilities to meet the specified goals of each mission. These missions use advanced instrumentation systems, such as laser altimeter, radar, lidar, and hyper-spectral instruments, which all require advanced on-board processing capabilities to facilitate the timely conversion of earth science data into earth science information. Currently available processing systems do not have the processing power required by these advanced information systems. Both an "order of magnitude" increase in processing power and the ability to "reconfigure on the fly" are required to implement algorithms that detect and react to events, to produce data products on-board for applications such as direct downlink, quick look, and "first responder" real-time awareness, to enable "sensor web" multi-platform collaboration, and to perform on-board "lossless" data reduction by migrating typical ground-based processing functions on-board, thereby reducing on-board storage and downlink requirements.

The SpaceCube™ is a Field Programmable Gate Array (FPGA) based on-board science data processing system developed at the NASA Goddard Space Flight Center (GSFC). The goal of the SpaceCube™ program is to provide one to two orders of magnitude improvements in on-board computing power while lowering relative power consumption and cost. The SpaceCube™ design strategy incorporates commercial radiation-tolerant FPGA technology and couples it with an upset mitigation software architecture to provide "order of magnitude" improvements in computing power over traditional radiation-hardened flight systems.

"On-the-fly" reconfiguration is a term describing the need to change computer programs and/or FPGA configuration and programming data after the board is manufactured or while in space. Typical FPGA based processing systems put much of the configuration and programming data in read only memory which can be programmed or burned only once when the processing system is manufactured, thereby limiting the amount of programming and configuration that may be modified later while the system is in use. Flash memory is a type of reprogrammable non-volatile memory device that offers some of the data retention advantages of read only memory (ROM) or programmable read only memory (PROM) while also having the ability to be reprogrammed. A flash memory device or "flash" is an electronic non-volatile computer memory device that can be electrically erased and reprogrammed. Flash memory is usually referred to by the type of logic gates used to implement the storage elements which are typically NAND or NOR gates. For example, NAND Flash is a flash memory device using NAND gates to store data. Flash memory provides a number of advantageous properties, such as operating on very low power. However, flash memory devices are not without their disadvantages. For example, flash memory devices may be influenced by exposure to radiation present in space flight. Prolonged exposure to radiation can reduce the overall lifespan of the devices and exposure to radiation can also result in single event latchup (SEL) causing the flash devices to draw excessive amounts of current, which, if left unchecked, can damage the devices or drain power from other systems.

Accordingly, it would be desirable to provide low power switching circuitry suitable for space-based flight and missions that addresses at least some of the problems identified above.

BRIEF DESCRIPTION

As described herein, the exemplary embodiments overcome one or more of the above or other disadvantages known in the art.

One aspect of the disclosed embodiments relates to a low power voltage control circuit for use in space missions. In one embodiment, the circuit includes a switching device coupled between an input voltage and an output voltage. The switching device includes a control input coupled to an enable signal, wherein the control input is configured to selectively turn the output voltage on or off based at least in part on the enable signal. A current monitoring circuit is coupled to the output voltage and configured to produce a trip signal, wherein the trip signal is active when a load current flowing through the switching device is determined to exceed a predetermined threshold and is inactive otherwise. The power voltage control circuit is constructed of space qualified components.

Another aspect of the disclosed embodiments relates to a low power voltage control system for use in space based processing systems. In one embodiment, the system includes a switching device configured to receive an input voltage and produce an output voltage. The switching device includes an enable input, wherein the switching device is on when the enable input is active and off otherwise. A current monitoring circuit is coupled to the output voltage and configured to produce a trip signal wherein the trip signal is active when a load current flowing through the switching device is above a predetermined threshold and inactive when the current is below the predetermined threshold. A monitoring device is coupled to the trip signal and to the enable input wherein the monitoring device is adapted to monitor the trip signal and turn the switching device off when the load current exceeds a predetermined threshold.

These and other aspects and advantages of the exemplary embodiments will become apparent from the following detailed description considered in conjunction with the accompanying drawings. It is to be understood, however, that the drawings are designed solely for purposes of illustration and not as a definition of the limits of the invention, for which reference should be made to the appended claims. Additional aspects and advantages of the invention will be set forth in the description that follows, and in part will be obvious from the description, or may be learned by practice of the invention. Moreover, the aspects and advantages of the invention may be realized and obtained by means of the instrumentalities and combinations particularly pointed out in the appended claims.

DETAILED DESCRIPTION

Figure 1:
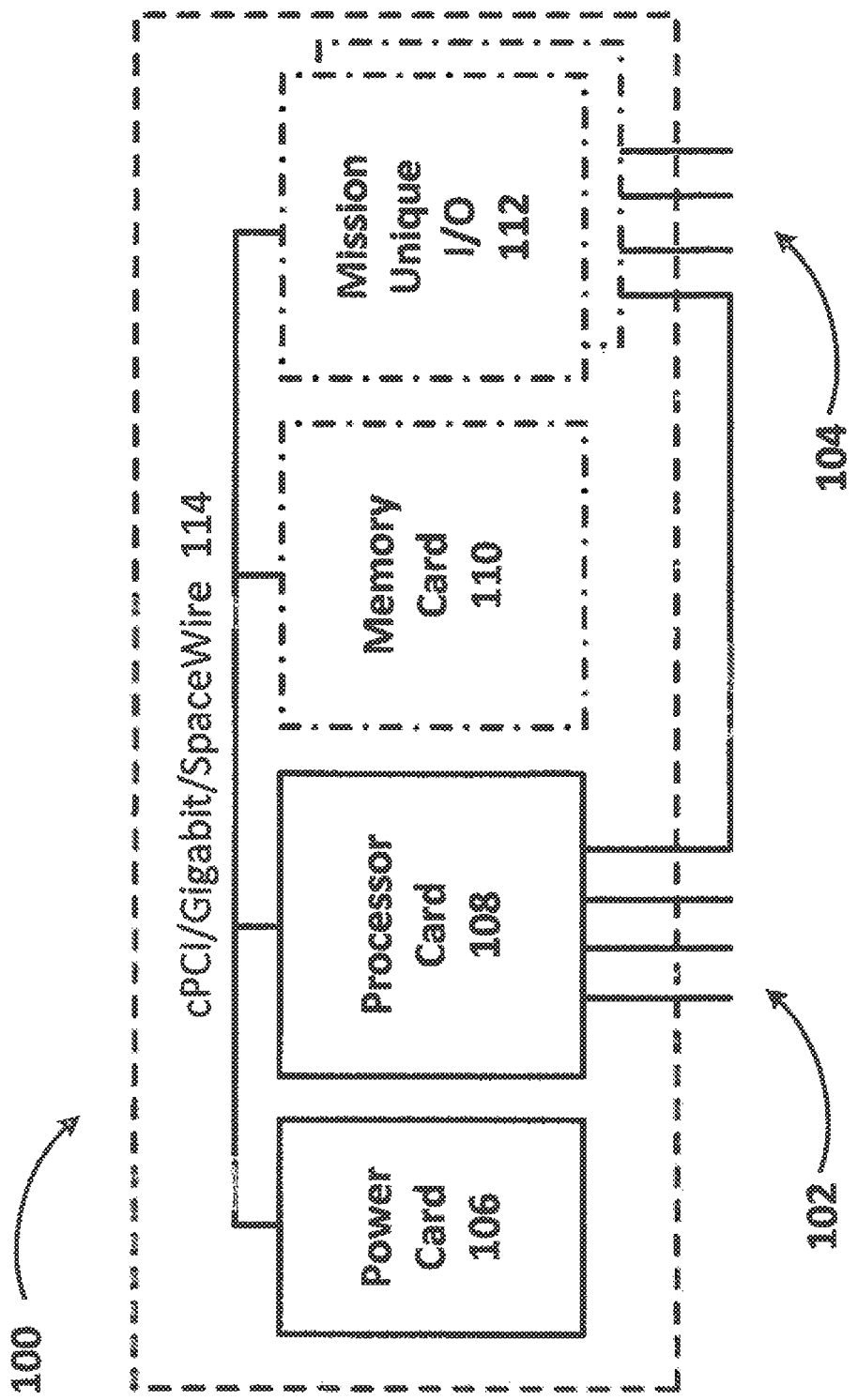
FIG. 1 illustrates a block diagram of a space qualified processing system incorporating aspects of the present disclosure.

FIG. 1 illustrates a card level architectural block diagram of a processing system generally indicated by numeral 100 designed for use in space missions. The processing system 100 is designed around a processor card 108 which is based on newly developed FPGA technology and is configured to provide advanced parallel processing capabilities as well as software mitigation. The processor board 108 is designed to provide one to two orders of magnitude improvements in on-board computing power while lowering relative power consumption and cost as compared to currently available space based processors. The processor card 108 includes a number of flash memory devices which may be electrically reprogrammed while in the system to provide on the fly reconfiguration capabilities required by space missions. The processor card 108 is supported by a power card 106, an optional memory card 110, and an optional mission unique input/output (I/O) card 112. To tie the power, processor, memory and I/O cards or boards 106, 108, 110, 112 together, a backplane 114 is included that provides a compact peripheral component interface (cPCI) bus as well gigabit Ethernet and SpaceWire networks.

The power card 106 provides a few widely used voltages that are consumed by the other cards 108, 110, 112 in the system. Voltages from the power card 106 are distributed to each of the other cards, where the voltages may be used directly or conditioned further by point of load (POL) power conditioning modules, which are physically located close to each load. The memory card 110 provides non-volatile data storage, which may be used to store mission data, such as instrument images, etc. Each space mission may include its own unique experiments and scientific instruments, which often have unique interface or input-output (I/O) requirements.

One or more mission unique I/O cards 112 can be included in the processing system to support the interface requirements of the experiments and instruments included in that mission. The mission unique I/O cards interface directly to the experiments and instruments through external interfaces 104, while the processor card 108 has a separate set of interfaces for standard data and analog I/O 102. In certain embodiments, it is desirable to allocate functions to physical boards differently than is shown in the processing system 100 of FIG. 1. For example, an engineering prototype may be created with all functionality on a single board.

Space missions typically have a finite amount of power available for use by the on-board systems and each subsystem needs to meet strict power budget requirements. It is, therefore, desirable to include means for selectively disabling power to components, such as, for example, flash memory devices, when they are not in use. Flash memory is susceptible to SEL, and therefore, needs to have protection circuitry that can monitor current and shut off the input voltage when an overcurrent condition is detected. Flash memory can be protected from the effects of radiation found in space by powering them down when not in use. It has also been found that flash memory devices last longer in a space environment when unpowered. Thus, flash memory is one example of a good candidate for selective power control. Analog and Ethernet circuits can also benefit from voltage switching because voltage switching adds flexibility for the user to allow switching off unneeded services.

Figure 2:
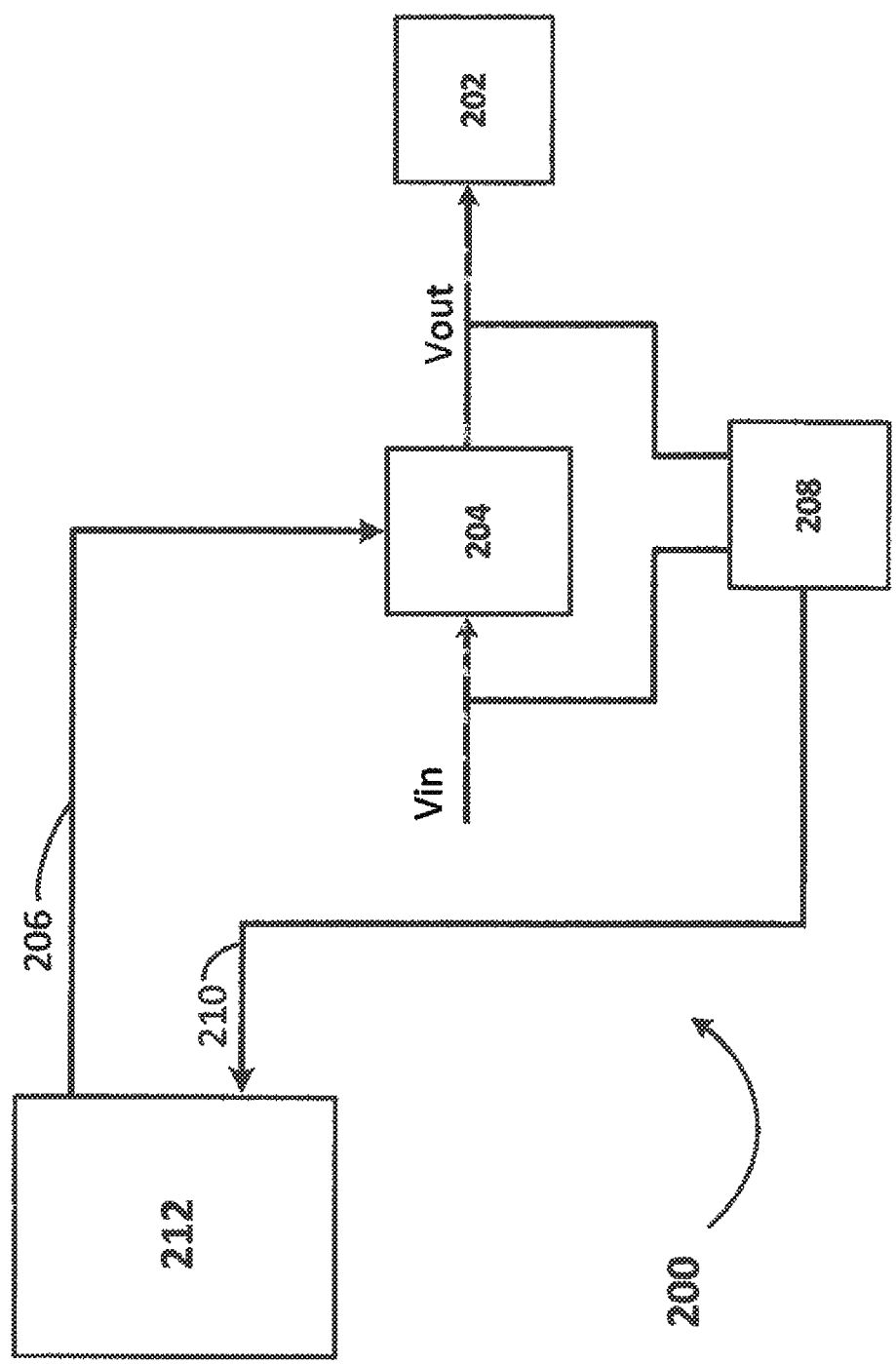
FIG. 2 illustrates a block diagram of a low power voltage control circuit incorporating aspects of the present disclosure.

FIG. 2 illustrates a block diagram of a power control circuit 200 which may be used as a low power voltage switch to control power to a small electronic device such as the flash memory modules on the processor card 108 described above. Turning off power to the flash memory, when it is not in use reduces overall power consumption of the processing system 100; protects against high current events, and single event upsets; and extends the overall life of the system in space. The power control circuit 200 receives an input power Vin and provides an output voltage Vout to a load 202, which may be any low power electronic device, such as a NAND Flash memory module. A power switching device 204, such as a metal oxide semiconductor field effect transistor (MOSFET), is coupled between the input voltage Vin and the output voltage Vout, and is used to selectively apply the input voltage Vin to the load 202. An Enable signal 206 is applied to the switching device 204 to turn the output voltage Vout on or off. By connecting the enable signal 206 to a monitoring device 212, which may include a computing device or other logic device, such as one of the FPGA devices on the processor card 108 described above with reference to FIG. 1, the output voltage Vout can be intelligently controlled, i.e., turned on or off, such that power consumption is minimized and the load 202 is protected from damage by high currents. It has been observed in laboratory experiments that radiation effects can create high current modes in flash memory devices, which, if left unchecked, can cause damage or failure of the flash memory. It is, therefore, advantageous to include current sensing circuitry 208 in the power control circuit 200. A power switching device 204, such as a MOSFET, has a small, but finite, on resistance Rds(on) when an enable signal 206 is applied to the device with sufficient voltage to drive the device into saturation. When the voltage of the enable signal 206 is sufficiently reduced, i.e., the enable signal 206 is deactivated, the power switching device 204 has a very high, and practically infinite, resistance and the device 204 is turned off. For example, typical MOSFETs of the size appropriate for the power control circuit 200 have a drain-to-source resistance in their ON state, Rds(on), of about 1.4 to 1.6 ohms. As current drawn by the load 202 increases, the output voltage Vout will drop slightly due to the ON resistance of the power switch 204. A current sense circuit 208 can be configured to sense this drop in the output voltage Vout and provide a trip signal 210 to indicate an overcurrent condition, such as when the current flowing through the switching device 204 exceeds a predetermined threshold amperage.

In certain embodiments, it is desirable to have the monitoring device 212 include a logic circuit or other processing device to monitor the trip signal 210 and to turn the output voltage Vout off by deactivating the enable signal 206, when the trip signal indicates an undesirable overcurrent condition. The monitoring device 212 can be a general purpose processing system including a memory and a processor and appropriate input and output signals, where the memory includes computer executable instructions defining a computer program or method for monitoring the trip signal 210 and operating the enable signal 206 such that the load 202 is protected against damage from excessive current. Alternatively, the monitoring device 212 may be a logic device, such as, for example, a FPGA or other suitable logic circuitry, configured to operate the enable signal 206 is a desired function based at least in part on the trip signal 210. The processing device 212 can implement filters or other logic on the trip signal 210 to eliminate any short duration current spikes, such as an in-rush current spike occurring when the output voltage Vout is turned on. It may also be desirable in some embodiments to configure the monitoring device 212 to account for the trip signal being in an active state when the switching device 204 is in its OFF state.

Figure 3:
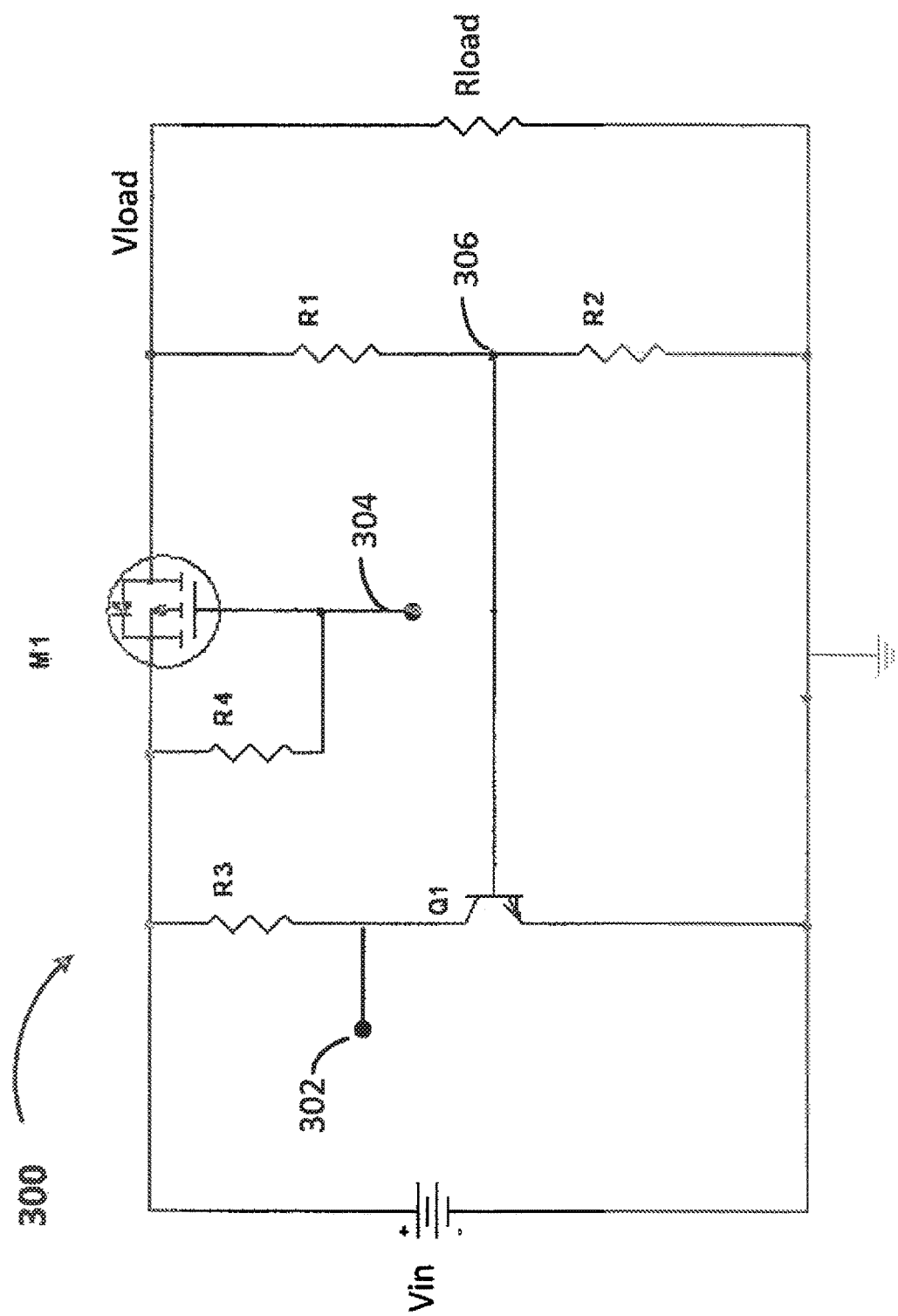
FIG. 3 illustrates a schematic diagram of one embodiment of a low power voltage control circuit incorporating aspects of the disclosed embodiments.

FIG. 3 illustrates a schematic diagram of one embodiment of a low power voltage control circuit generally indicated by numeral 300. The low power voltage control circuit 300 is appropriate for controlling power required by NAND flash memory modules or similar low power electronic devices. The load, which in certain embodiments is a flash memory module, is represented by a resistance Rload. Typical NAND flash memory modules use a supply voltage between about 2.7 volts DC (V) and 3.3V and consume less than about a watt of power. The voltage control circuit 300 includes a current monitoring circuit that actively monitors current flowing through a power switching device M1 and produces a trip signal 302 when the current exceeds a predetermined threshold value. Use in space base systems requires that the voltage control circuit 300 be small in size, have small power consumption, and use parts that have been approved for space flight. The power control circuit 300 is designed to use external logic or processing device (not shown) to monitor the over current indication or trip signal 302 and produce an enable signal 304, which will selectively turn the power switching device M1 on or off. In certain embodiments, an FPGA is used to monitor the trip signal 302 and produce the enable signal 304. Alternatively, any suitable logic device or computing system may be advantageously employed. The power control circuit 300 features a low power voltage switch M1 that provides good voltage regulation for loads with low current requirements. The power control circuit 300 includes overcurrent detection, is constructed from space qualified parts, and uses very small board real-estate, for example, less than 0.040 square inches.

In one embodiment, the control circuit 300 uses a p-channel MOSFET M1 with low drain to source on resistance $R_{DS(on)}$ to switch the load voltage Vload ON and OFF. When the load current is low, such as about 40 milliamps (mA), the load voltage Vload will be close to the input voltage Vin. External logic is used to provide an active low enable signal 304 so that when the enable signal 304 is low the MOSFET M1 is ON. A pull up resistor R4 is coupled between the gate and source of the MOSFET M1 to ensure the MOSFET M1 is OFF when power is applied to the circuit. Once the enable signal 304 is activated current flows through the MOSFET M1 into the load which is represented by a resistance Rload. While in the ON state the MOSFET on resistance $R_{DS(on)}$ provides a small voltage drop across the MOSFET M1. A voltage divider network is create by a pair of series connected resistors R1 and R2 such that a current sensing signal is create at a central node 306 between the two resistors R1 and R2. This current sensing signal is applied to the base of an N-P-N bipolar junction transistor (BJT) Q1 which has its collector connected through a pull-up resistor R3 to the input voltage Vin and its emitter connected to ground such that a trip signal 302 is created at the collector terminal of the transistor Q1. When the current flowing through the MOSFET M1 is below a predetermined threshold current, the current sensing signal 306 will have a voltage greater than or equal to the turn on voltage of transistor Q1 thus pulling the trip signal low. As the current through the MOSFET M1, increases the voltage of the load Vload, and in turn, the voltage of the current sensing signal 306, will fall. The value of resistors R1 and R2 are chosen such that when the current through the MOSFET M1 exceeds a desired threshold value the voltage of the current sensing signal 306 will fall below the turn on voltage of the transistor Q1 causing the transistor Q1 to turn off thereby allowing the pull-up resistor R3 to raise the trip signal to the input voltage Vin. The trip signal 302 is an active high signal so when trip signal 302 is to equal the input voltage Vin the trip signal 302 is active indicating the current through the load Rload is at or above the predetermined threshold value. An external logic circuit (not shown) can be used to monitor the trip signal 302 and deactivate the enable signal 304 to shut of the voltage switching device M1 to turn the load voltage Vload OFF.

In certain applications, such as when flash memory modules are being protected from overcurrent conditions, the trip current threshold at which the trip signal 302 is activated does not need to be highly accurate because the purpose is just protection from SEL or other high current conditions. This allows the trip signal 302 to be produced by a circuit having only a few components thus yielding a circuit with small size and low power consumption.

Analysis of the trip current circuit may be simplified by noting that the transistor Q1 has a high current gain resulting in a collector current that is much greater than the base current so it can be assumed that the base current is zero. With this simplification the load voltage Vload is regulated according to the following equation (1):

$$V_{load} = V_{CC} - I_{load} \times R_{DS(ON)} \qquad (1),$$

where Vload is the voltage across the load Rload, Vcc is the input voltage Vin of the power control circuit 300, and $R_{DS(on)}$ is the drain to source resistance of the MOSFET M1 while the MOSFET M1 is in the ON state. The base-to-emitter voltage $V_{BE}$ seen at the base of transistor Q1 can be calculated from the following equation (2):

$$V_{BE} = V_{load} \times \frac{R_2}{R_1 + R_2}. \qquad (2)$$

The point where the transistor Q1 turns off, which is also the point at which the trip signal 302 goes active, is when the base-to-emitter voltage $V_{BE}$ of the transistor Q1 is equal to the turn on voltage $V_{BE(on)}$ of the transistor Q1. Thus it can be shown that the ratio of the voltage divider resistors R1 and R2 follow the relationships show below in equation (3):

$$\frac{R_1}{R_2} = \frac{V_{Trip}}{V_{BE(ON)}} - 1 = \frac{V_{CC} - I_{Trip} \times R_{DS(ON)}}{V_{BE(ON)}} - 1, \qquad (3)$$

where $V_{Trip}$ is the voltage of the current sensing signal 306 and $I_{Trip}$ is the desired threshold current at which the trip signal 302 should go active. In certain embodiments, the current sensing signal 302 voltage and the turn on voltage $V_{BE(on)}$ of the transistor Q1 operate within about 100 millivolts of each other, thus it is important to use low tolerance, for example, less that about 5%, components for the resistors R1 and R2.

The power control circuit 300 was tested by building the circuit using a flash memory module in place of the load resistance Rload. The NAND flash module used required a supply voltage of about 2.7 to 3.6V with a nominal current draw of about 40 mA. When exposed to radiation, NAND flash modules of the type used in space missions can exhibit SEL causing excessive current draw which over time can damage the memory module. To protect against the high currents caused by SEL, the trip current threshold was set to about 150 to 200 mA. The trip current is the amount of load current at which the trip signal 302 switches form the inactive to the active state. The MOSFET M1 used has an ON state drain-to-source resistance $R_{DS(on)}$ of about 1.6 ohms yielding a nominal load voltage Vload of 3.24 Volts which is well within the specified supply voltage range of the flash module. The voltage divider resistors R1, R2 were set to R1=3.6KΩ and R2=1KΩ which gives a nominal trip current of 194 mA. The current sense signal 306, which is also the base voltage of the transistor Q1, becomes: $V_{BE}$=3.24*[1K/(1K+3.6K)]=0.704V, which is above a nominal $V_{BE(ON)}$ of the transistor Q1 which is typically about 0.65V. With the transistor Q1 ON, the trip signal 302 will be pulled low to about the collector to emitter saturation voltage $V_{CE(SAT)}$ which for the components used is about 0.2V. Power consumption of the circuit 300 is less than 10 milliwatts (not including the power consumed by the load Rload) when the MOSFET M1 is ON and is effectively zero in the OFF state.

Most semiconductor devices, such as the transistors M1 and Q1, used in the power control circuit 300 have properties that vary with temperature. These variations can lead to undesirable changes in the trip current threshold over the operating temperature range, such as for example the military temperature range of –55 to 125 degrees centigrade (C). The turn ON voltage $V_{BE(on)}$ of the transistor Q1 is inversely proportional to temperature so as temperature increases the voltage needed to turn on the transistor decreases. The change in turn on voltage $V_{BE(on)}$ over temperature is fairly linear and can be approximated as –2 mV per degree centigrade. The load voltage will also decrease with rising temperature since the ON resistance $R_{DS(on)}$ of the MOSFET M1 increases with rising temperature. The ON resistance $R_{DS(on)}$ and the turn on voltage $V_{BE(on)}$ both move in the same direction with temperature, however they change at different rates and the effect of the turn on voltage $V_{BE(on)}$ is more significant than the effect of the ON resistance $R_{DS(on)}$. These differences result in a lower trip current threshold at lower temperatures and a higher trip current threshold at higher temperatures. The temperature effects on the load voltage are shown by equation (4):

$$V_{load}(T) = V_{CC} - I_{load}\left(R_{DS(ON)} - 5\frac{mV}{C}(T - T_x)\right), \tag{4}$$

where $T_x$ is a nominal temperature at which the circuit is designed such as for example about 25° C. and T is the current temperature of the circuit. The effect on the transistor Q1 turn on voltage is shown by equation (5):

$$V_{BE(ON)}(T) = V_{BE(ON)} - 2\frac{mV}{C}(T - T_x). \tag{5}$$

Setting equation (4) equal to equation (5) yields equation (6) showing the relationship of trip current threshold to temperature $I_{Trip}(T)$:

$$I_{Trip}(T) = \frac{V_{CC} - \left(\frac{R_1 + R_2}{R_2}\right)\left(V_{BE(ON)} - 2\frac{mV}{C}(T - T_x)\right)}{R_{DS(ON)} + 5\frac{mV}{C}(T - T_x)}. \tag{6}$$

In order to fully compensate for the temperature effects on the trip current, in one embodiment, additional circuit elements would need to be added to the power control circuit 300 such that the change in the trip current threshold with temperature is zero. This would require many additional components and would use significant additional board space. However, acceptable results can be achieved by adding a simple thermistor to the circuit. Since the ON resistance and the turn on voltage are relatively linear, a thermistor with a linear temperature response can be used to achieve acceptable temperature stabilization. Placing a positive temperature coefficient (PTC) thermistor in place of or in series with the upper resistor R1 in the resistor divider network of FIG. 3 an yield a circuit where the trip current threshold changes only moderately over the entire military temperature range of –55° C. to 125° C.

Figure 4:
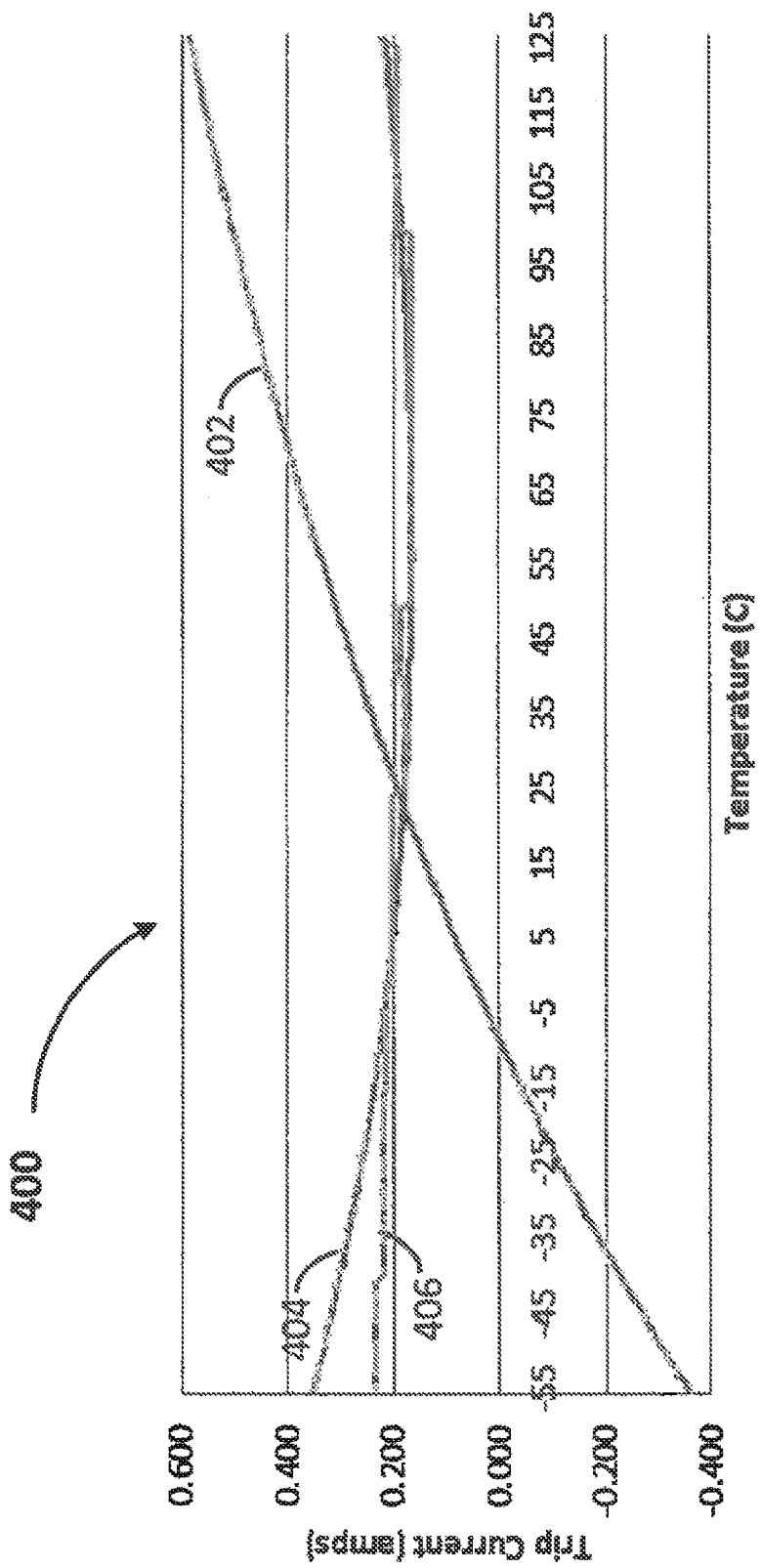
FIG. 4 illustrates the effects of temperature on trip current in low power voltage control circuits incorporating aspects of the present disclosure.

FIG. 4 illustrates a graph 400 showing the effects of temperature on trip current for a few different arrangements of thermistors. The vertical axis shows the trip current in amps and the horizontal axis shows degrees centigrade over the military temperature range of –55° C. to 125° C. For reference, the line or curve 402 shows a plot of trip current for the power control circuit 300 where R1=3.6KΩ and R2=1KΩ without the addition of any temperature compensation. The circuit is designed to provide a nominal trip current of about 194 mA at a nominal design temperature of room temperature which is about 25° C. Without temperature compensation the trip current changes as temperature changes at a rate of about 5 mA/° C. This circuit would be acceptable for only a small temperature range.

The line or curve 404 illustrates the trip current of the power control circuit 300 when a thermistor commonly used by the automotive industry is used for temperature compensation. In this configuration, R1 of FIG. 3 was replaced by an automotive industry thermistor having a resistance of 1KΩ at 25° C. and R2 was set to 275Ω. The curve 404 shows a significant improvement in stability of the trip current, which varies from a high of about 350 mA at –55° C. to about 190 mA when the circuit temperature climbs to about 55° C. The rate of change of the thermistor resistance as temperature changes works well to balance the circuit without the need for a fixed resistor R1.

Line or curve 406 illustrates the trip current of the power control circuit 300 when a space qualified thermistor is used for temperature compensation. In the circuit used for graph 400, a thermistor was placed in series with R1 between R1 and the current sensing signal 306. The thermistor used has a resistance of 1KΩ at 25° C., R1 was set to 1KΩ, and R2 was set to 550Ω. Although this circuit requires the use of both a thermistor and a fixed resistor R1, this circuit provides a flatter temperature response at the cooler end of the military temperature range.

Figure 5:
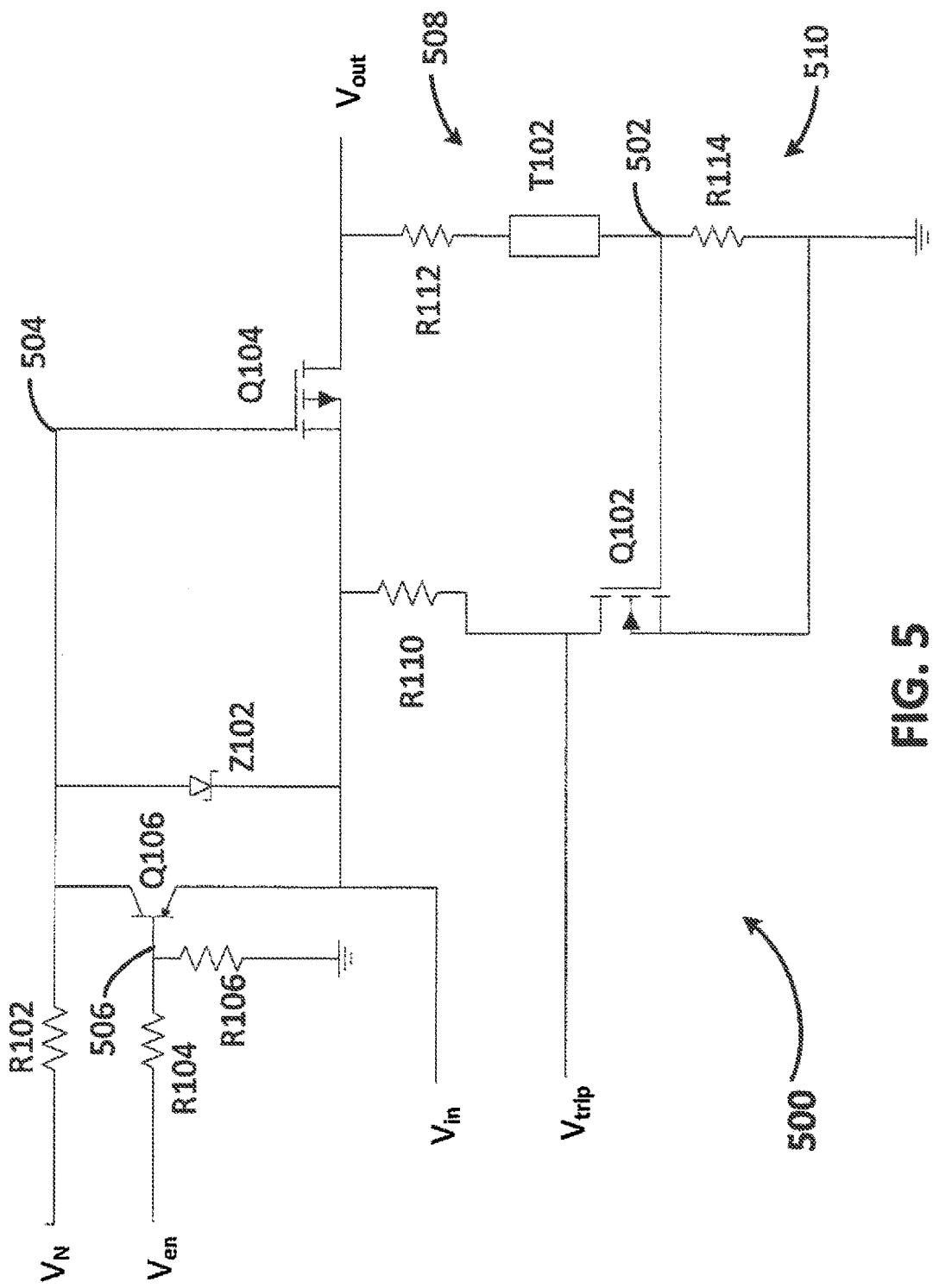
FIG. 5 illustrates a schematic diagram of a temperature compensated low power voltage control circuit incorporating aspects of the disclosed embodiments.

FIG. 5 illustrates an embodiment of a low power voltage control circuit 500 that includes a temperature compensated trip signal Vtrip as well as additional circuitry to ensure the power switching device Q104 is fully turned on when the enable signal $V_{en}$ is activated by a low power logic circuit, such as, for example, a radiation tolerant FPGA device or other appropriate logic or computing device. The voltage control circuit 500 uses a MOSFET for the semiconductor switching device Q104 coupled between an input voltage Vin and the output voltage Vout. The semiconductor switching device Q104 will selectively turn the output voltage Vout on or off when the switching device Q104 is in a conducting or non-conducting state as controlled by the enable signal Ven being activated or deactivated respectively.

In the embodiment shown in FIG. 5, the semiconductor switching device or switch Q104 is a P-channel MOSFET with its source coupled to the input voltage Vin and its drain coupled to the output voltage Vout. Alternatively, any suitable semiconductor switching device may be advantageously employed including other types of field effect transistors or bipolar junction transistors. The control input 504 of the semiconductor switching device Q104, which is the gate of the p-channel MOSFET, is used to turn the output voltage Vout on by driving the semiconductor switching device Q104 into saturation or fully conducting mode and to turn the output voltage Vout off by placing the semiconductor switching device Q104 in its non-conducting mode. The control input 504 or gate of semiconductor switching device Q104 is tied through a resistor R102 to a negative voltage $V_N$ and a zener diode Z102 is coupled between the gate and source of the semiconductor switching device Q104 to limit the gate to source voltage applied to the semiconductor switching device Q104. The use of the negative voltage $V_N$ ensures saturation or full turn on of the semiconductor switching device Q104 when using relatively small input voltages Vin, such as, for example, about 3.3V, as is appropriate for driving a NAND flash memory device.

To operate the semiconductor switching device Q104, an enable signal Ven is received by a resistor divider network including a series connected pair of resistors R104 and R106. In the illustrated embodiment, the value of R106 is made much greater than the value of R104 so that R104 handles the turn-on condition. The central node 506 between resistor R104 and R106 is connected to the control input of a semiconductor switching device Q106, which in the illustrated embodiment is a p-n-p bipolar junction transistor with its collector and emitter connected between the gate and source of the semiconductor switching device Q104 and in parallel with both the resistor R108 and the zener diode Z102. The enable signal Ven is an active high signal meaning that when the enable signal Ven is dropped to a low voltage, such as circuit ground 508 potential, when the semiconductor switching device Q104 is turned off. When the enable signal Ven is raised to the input voltage Vin, the semiconductor switching device Q104 is turned on.

The low power voltage control circuit 500 includes active current monitoring and produces an over current trip signal Vtrip to indicate when the current flowing through the semiconductor switching device Q104 exceeds a predetermined threshold amperage. Current monitoring is accomplished using a voltage divider or resistor divider network formed by series connected resistive devices R112, T102, and R114, where a resistor R112 and a thermistor T102 form an upper leg 508 of the voltage divider network and a single resistor R114 forms a lower leg 510 of the voltage divider network. Alternatively, other arrangements of resistors and thermistors may be advantageously used in the upper leg 508 and lower leg 510 to produce a desired current sensing signal. A current sensing signal 502, which is proportional to the current flowing through the semiconductor switching device Q104, is produced at a central node 502 formed between the thermistor T102 and the resistor R114. The current sensing signal 502 is applied to the control input of a current sensing switch Q102, which in the embodiment shown is a MOSFET. Alternatively, the current sensing switch Q102 may be any suitable switching device such as a BJT or FET.

In one embodiment, the drain of the current sensing switch Q102 is connected through a pull-up resistor R110 to the input voltage Vin and the source of the current sensing switch Q102 is connected to circuit common 508, which in certain embodiments may also be circuit ground. In operation there will be a small voltage drop across the semiconductor switching device Q104 due to the on resistance $R_{DS(on)}$ of the device. The resistor divider network formed by resistance devices R112, T102, R114 is designed to provide a current sensing signal 502 voltage that is above the gate to source turn-on voltage of the current sensing switch Q102, when the load current is within a desired normal range, causing the current sensing switch Q102 to be in its fully conducting or on state, resulting in a low or inactive trip signal Vtrip. When current drawn by the load increases, the output voltage Vout will drop, resulting in a voltage drop of the current sensing signal 502. In certain embodiments, it is advantageous to add a resistor between the drain of the current sensing switch Q102 and the load Vout. This is useful in circuits requiring a larger drain to source resistance $R_{DS(on)}$, such as when the load is an analog circuit requiring an input voltage of about 12 volts. Once the load current reaches or exceeds a predetermined threshold amperage, the current sensing signal 502 voltage will drop below the turn on voltage of current sensing switch Q102 causing the current sensing switch Q102 to turn off and the trip signal Vtrip will be pulled up to the input voltage Vin by the pull-up resistor R110 providing a high or active trip signal Vtrip. A logic or computing device (not shown) may be connected to the trip signal and be programmed or configured to turn off the enable signal Ven when the trip signal Vtrip goes active. In certain embodiments, it is desirable to include further programming or logic to filter the trip signal Vtrip to avoid turning the output voltage Vout off during transient high current conditions, such as inrush currents occurring during initial turn on. Additional programming or logic may also be desirable to account for the trip signal Vtrip being in the high or active state while the semiconductor switching device Q104 is turned off.

Thus, while there have been shown, described and pointed out, fundamental novel features of the invention as applied to the exemplary embodiments thereof, it will be understood that various omissions and substitutions and changes in the form and details of devices and methods illustrated, and in their operation, may be made by those skilled in the art without departing from the spirit and scope of the invention. Moreover, it is expressly intended that all combinations of those elements, which perform substantially the same function in substantially the same way to achieve the same result, are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A low power voltage control circuit for use in space missions to provide increased computing power, thermal stability, and reconfigurability with low power operating requirements, the low power voltage control circuit comprising:
   a switching device coupled between an input voltage and an output voltage and comprising a control input coupled to an enable signal, wherein the control input is configured to selectively turn the output voltage on or off based at least in part on the enable signal; and
   a current monitoring circuit coupled to the output voltage and configured to produce a trip signal, wherein the trip signal is active, when a load current flowing through the switching device is determined to exceed a predetermined threshold and is inactive otherwise,
   wherein the low power voltage control circuit comprises space qualified components, including at least one space tolerant FPGA device, providing increased the computing power, the thermal stability, and the reconfigurability.

2. The low power voltage control circuit of claim 1, wherein the switching device comprises a p-channel MOSFET, wherein the MOSFET comprises a gate, a source, and a drain, and
   wherein the source is coupled to the input voltage, the drain is coupled to the output voltage, and the gate of the MOSFET is coupled to the enable signal.

3. The low power voltage control circuit of claim 2, wherein the gate is set to the input voltage when the output voltage is off, and the gate is set to a negative voltage, when the output voltage is on.

4. The low power voltage control circuit of claim 1, wherein the current monitoring circuit comprises a voltage divider circuit having an upper leg coupled to the output voltage and a lower leg coupled to ground wherein a central node produces a monitoring voltage proportional to the load current.

5. The low power voltage control circuit of claim 1, wherein the voltage divider circuit comprises at least one thermistor configured to maintain the predetermined threshold at a generally constant value over an operating temperature range of the circuit.

6. The low power voltage control circuit of claim 5, wherein the current monitoring circuit comprises a MOSFET with a gate of the MOSFET coupled to the monitoring voltage and a source of the MOSFET coupled to the trip signal.

7. The low power voltage control circuit of claim 5, wherein the current monitoring circuit comprises a BJT with a base of the BJT coupled to the monitoring voltage and a collector of the BJT coupled to the trip signal.

8. A low power voltage control system for use in space missions to provide increased computing power, thermal stability, and reconfigurability with low power operating requirements, the low power voltage control system comprising:
   a switching device configured to receive an input voltage and produce an output voltage and comprising an enable input, wherein the switching device is on when the enable input is active and off otherwise;
   a current monitoring circuit coupled to the output voltage and configured to produce a trip signal wherein the trip signal is active when a load current flowing through the switching device is above a predetermined threshold and inactive when the current is below the predetermined threshold; and
   a monitoring device coupled to the trip signal and to the enable input, wherein the monitoring device monitors the trip signal and turns the switching device off when the load current exceeds a predetermined threshold,
   wherein the low power voltage control circuit provides increased the computing power, the thermal stability, and the reconfigurability.

9. The low power voltage control system of claim 8, wherein the monitoring device filters the trip signal to eliminate transient over current conditions.

10. The low power voltage control system of claim 8, wherein the monitoring device comprises a space tolerant FPGA device.

11. The low power voltage control system of claim 8, wherein the switching device comprises a p-channel MOSFET,
   wherein the MOSFET comprises a gate, a source, and a drain, and
   wherein the source is coupled to the input voltage, the drain is coupled to the output voltage, and the gate of the MOSFET is coupled to the enable signal.

12. The low power voltage control device of claim 8, wherein the current monitoring circuit comprises a voltage divider network having an upper leg coupled to the output voltage, a lower leg coupled to circuit ground, and a central node producing a voltage proportional to the load current.

13. The low power voltage control system of claim 12, wherein the upper leg comprises a thermistor configured to maintain the predetermined threshold at a generally constant value over an operating temperature range of the system.

* * * * *